United States Patent
Lin et al.

(10) Patent No.: US 8,633,048 B2
(45) Date of Patent: Jan. 21, 2014

(54) METHOD FOR FABRICATING PACKAGE STRUCTURE HAVING MEMS ELEMENTS

(75) Inventors: Chen-Han Lin, Taichung Hsien (TW); Hong-Da Chang, Taichung Hsien (TW); Cheng-Hsiang Liu, Taichung Hsien (TW); Hsin-Yi Liao, Taichung Hsien (TW); Shih-Kuang Chiu, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 132 days.

(21) Appl. No.: 13/314,807

(22) Filed: Dec. 8, 2011

(65) Prior Publication Data

US 2013/0017643 A1 Jan. 17, 2013

(30) Foreign Application Priority Data

Jul. 11, 2011 (TW) .............................. 100124413 A

(51) Int. Cl.
*H01L 21/00* (2006.01)

(52) U.S. Cl.
USPC ............... 438/50; 438/52; 438/401; 438/456; 438/462

(58) Field of Classification Search
None
See application file for complete search history.

(56) References Cited

U.S. PATENT DOCUMENTS

| | | | |
|---|---|---|---|
| 6,521,477 B1 * | 2/2003 | Gooch et al. | 438/106 |
| 7,422,962 B2 * | 9/2008 | Chen et al. | 438/456 |
| 7,682,934 B2 * | 3/2010 | Chen et al. | 438/458 |
| 8,349,635 B1 * | 1/2013 | Gan et al. | 438/50 |
| 8,399,940 B2 * | 3/2013 | Lin et al. | 257/419 |
| 8,454,789 B2 * | 6/2013 | Diep et al. | 156/267 |
| 2003/0122227 A1 * | 7/2003 | Silverbrook | 257/678 |
| 2004/0077121 A1 * | 4/2004 | Maeda et al. | 438/75 |
| 2004/0099917 A1 * | 5/2004 | Greathouse et al. | 257/414 |
| 2004/0104460 A1 * | 6/2004 | Stark | 257/678 |
| 2004/0121517 A1 * | 6/2004 | Silverbrook | 438/106 |
| 2004/0259325 A1 * | 12/2004 | Gan | 438/456 |
| 2005/0176166 A1 * | 8/2005 | Chen et al. | 438/51 |
| 2006/0185429 A1 * | 8/2006 | Liu et al. | 73/146.5 |
| 2007/0190691 A1 * | 8/2007 | Humpston et al. | 438/113 |
| 2008/0111203 A1 * | 5/2008 | Pan et al. | 257/415 |
| 2009/0029500 A1 * | 1/2009 | Wan | 438/51 |
| 2010/0193884 A1 * | 8/2010 | Park et al. | 257/414 |
| 2012/0292722 A1 * | 11/2012 | Lin et al. | 257/415 |
| 2013/0020713 A1 * | 1/2013 | Premachandran et al. | 257/773 |

* cited by examiner

*Primary Examiner* — David E Graybill
(74) *Attorney, Agent, or Firm* — Edwards Wildman Palmer LLP; Peter F. Corless; Steven M. Jensen

(57) ABSTRACT

A fabrication method of a package structure having MEMS elements includes: disposing a plate on top of a wafer having MEMS elements and second alignment keys; cutting the plate to form therein a plurality of openings exposing the second alignment keys; performing a wire bonding process and disposing block bodies corresponding to the second alignment keys, respectively; forming an encapsulant and partially removing the encapsulant and the block bodies from the top of the encapsulant; and aligning through the second alignment keys so as to form on the encapsulant a plurality of metal traces. The present invention eliminates the need to form through holes in a silicon substrate as in the prior art so as to reduce the fabrication costs. Further, since the plate only covers the MEMS elements and the encapsulant is partially removed, the overall thickness and size of the package structure are reduced.

16 Claims, 5 Drawing Sheets

METHOD FOR FABRICATING PACKAGE STRUCTURE HAVING MEMS ELEMENTS

CROSS-REFERENCES TO RELATED APPLICATIONS

This application claims under 35 U.S.C. §119(a) the benefit of Taiwanese Application No. 100124413, filed Jul. 11, 2011, the entire contents of which is incorporated herein by reference.

BACKGROUND OF THE INVENTION

1. Field of the Invention

The present invention relates to fabrication methods of package structures, and, more particularly, to a fabrication method of a package structure having MEMS (micro-electromechanical system) elements.

2. Description of Related Art

MEMS elements have integrated electrical and mechanical functions and can be fabricated through various micro-fabrication technologies. A MEMS element can be disposed on a substrate and covered by a shield or packaged with an underfill adhesive so as to protect against damage caused by the external environment.

FIG. 1 shows a cross-sectional view of a conventional package structure having a MEMS element. Referring to FIG. 1, a MEMS element 11, such as a pressure-sensing element, is disposed on an LGA (land grid array) substrate 10 and conductive pads 111 of the MEMS element 11 are electrically connected to conductive pads 101 of the LGA substrate 10 through a plurality of bonding wires. Further, a metal lid 12 is disposed on the substrate 10 for covering the MEMS element 11 so as to protect the MEMS element 11 against external damage and pollution. However, such a package structure has a large size and cannot meet the demand for lighter, thinner and smaller electronic products.

Accordingly, FIG. 2 shows a wafer-level package structure as disclosed by US Patent Application No. 2006/0185429. Referring to FIG. 2, a plurality of MEMS elements 21, such as pressure-sensing elements, are directly formed on a silicon substrate 23, and glass lids 24 are attached to the MEMS elements 11 through anodic bonding.

Further, the silicon substrate 23 has sensing cavities 231 and through holes 232 formed therein by using TSV (through silicon via) technology. Such TSV technology uses KOH as an etchant for forming the through holes or recesses.

Compared with the previously described package structure, the present package structure has a greatly reduced size. However, the TSV technology for forming the through holes and recesses is costly and requires a high degree of accuracy, thus complicating the fabrication process and increasing the fabrication cost.

Therefore, it is imperative to overcome the above-described drawbacks of the prior art.

SUMMARY OF THE INVENTION

Accordingly, the present invention provides a fabrication method of a package structure having MEMS elements, which comprises the steps of: preparing a plate having opposite first and second surfaces and preparing a wafer having opposite third and fourth surfaces, wherein the first surface of the plate has a plurality of first alignment keys, a plurality of recesses and a plurality seal rings disposed around peripheries of the recesses, and the third surface of the wafer has a plurality of MEMS elements, a plurality of electrical contacts and a plurality of second alignment keys; bonding the plate and the wafer together by aligning the first alignment keys of the plate with the second alignment keys of the wafer and disposing the seal rings on the third surface of the wafer such that the MEMS elements of the wafer are disposed in the recesses and enclosed by the seal rings of the plate; thinning the plate from the second surface thereof; forming on the second surface of the plate a plurality of third alignment keys corresponding to the second alignment keys of the wafer, respectively; forming a metal layer on the second surface of the plate; cutting the plate to form therein a plurality of openings exposing the electrical contacts and the second alignment keys; connecting the electrical contacts and the metal layer through a plurality of bonding wires; disposing a plurality of block bodies over the second alignment keys through an adhesive such that top surfaces of the block bodies are higher than the bonding wires; forming an encapsulant on the third surface of the wafer so as to encapsulate the plate, the electrical contacts, the block bodies and the bonding wires; partially removing the encapsulant, the bonding wires and the block bodies from a top surface of the encapsulant so as to expose one ends of the bonding wires and the block bodies; and aligning through the second alignment keys so as to form on the encapsulant a plurality of metal traces electrically connected to the electrical contacts through the bonding wires.

The present invention eliminates the need to form through holes in a silicon substrate as in the prior art so as to decrease equipment and fabrication costs. Further, since the plate only covers the MEMS elements and does not cover the bonding wires, and portions of the bonding wires are removed, the overall thickness and size of the package structure are reduced.

DETAILED DESCRIPTION OF PREFERRED EMBODIMENTS

The following illustrative embodiments are provided to illustrate the disclosure of the present invention and its advantages, these and other advantages and effects being apparent to those in the art after reading this specification.

It should be noted that the drawings are only for illustrative purposes and not intended to limit the present invention. Meanwhile, terms such as 'up', 'down', 'a' and so on are only used as a matter of descriptive convenience and not intended to have any other significance or provide limitations for the present invention.

FIGS. 3A to 3K show a fabrication method of a package structure having MEMS elements according to the present invention. Therein, FIG. 3G' is a top view of FIG. 3G, and FIG. 3J' is another embodiment of FIG. 3J.

Figure 1:
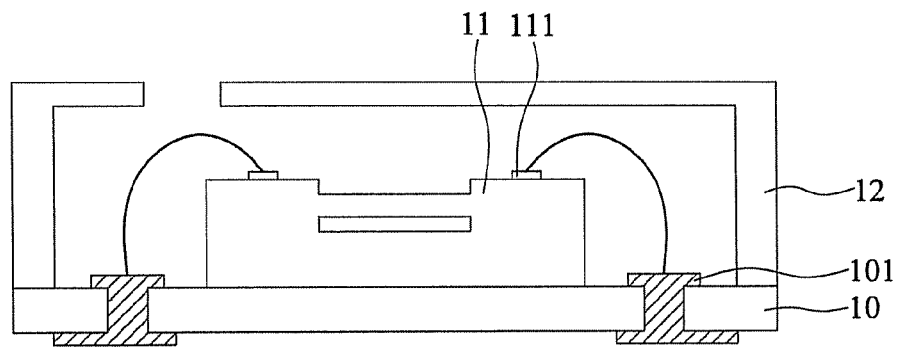
FIG. 1 is a cross-sectional view showing a conventional package structure having a MEMS element.
Figure 2:
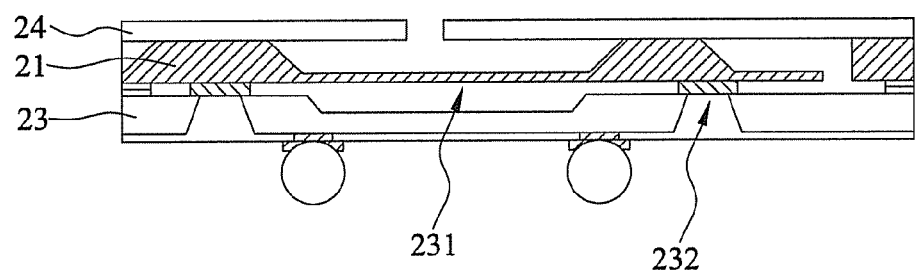
FIG. 2 is a cross-sectional view showing another conventional package structure having MEMS elements.
Figure 3A:
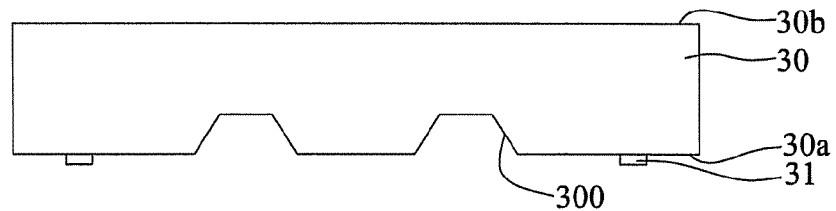
FIGS. 3A to 3K are cross-sectional views showing a fabrication method of a package structure having MEMS elements according to the present invention, wherein FIG. 3G' is a top view of FIG. 3G, and FIG. 3J' shows another embodiment of FIG. 3J.

Referring to FIG. 3A, a plate 30 having a first surface 30a with a plurality of first alignment keys 31 and a second surface 30b opposite to the first surface 30a is provided. The plate 30 can be made of glass or a silicon-containing material. Further, a plurality of recesses 300 are formed on the first surface 30*a* of the plate 30 through a process such as DRIE, KOH or TMAH etching.

Figure 3B:
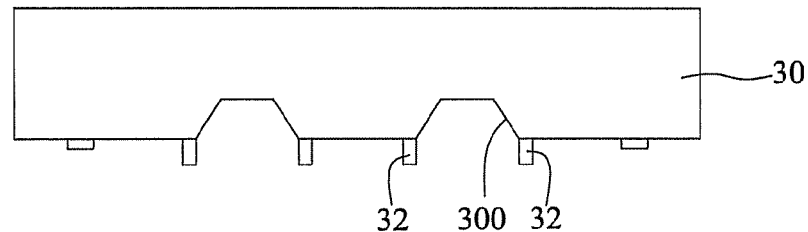

Referring to FIG. 3B, a plurality of seal rings 32 is disposed around the peripheries of the recesses 300, respectively. The seal rings 32 can be made of glass frit, epoxy, dry film, Au, Cu, AuIn, solder, Ge, AlGe or SiGe.

Figure 3C:
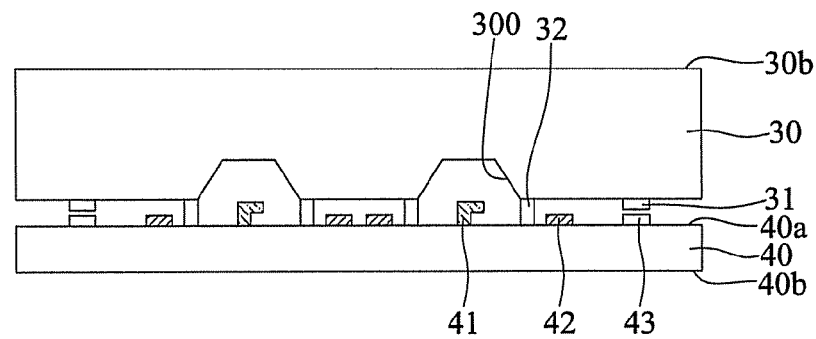

Referring to FIG. 3C, a wafer 40 having a third surface 40*a* and a fourth surface 40*b* opposite to the third surface 40*a* is provided. The third surface 40*a* has a plurality of MEMS elements 41, a plurality of electrical contacts 42 and a plurality of second alignment keys 43. To bond the plate 30 and the wafer 40 together, the first alignment keys 31 of the plate 30 are aligned with the second alignment keys 43 of the wafer 40, respectively, and the seal rings 32 of the plate 30 are disposed on the third surface 40*a* of the wafer 40 such that the MEMS elements 41 are correspondingly disposed in the recesses 300 and enclosed by the seal rings 32. As such, the MEMS elements 41 are hermetically sealed in the recesses 300, respectively. The MEMS elements 41 can be, for example, gyroscopes, accelerometers or RF MEMS elements.

Figure 3D:
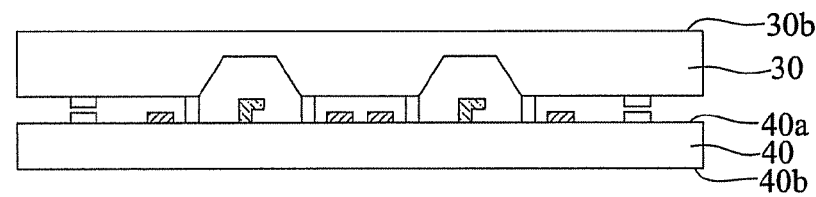

Referring to FIG. 3D, the plate 30 is partially removed from the second surface 30*b* so as to have a thickness of 200 to 300 μm.

Figure 3E:
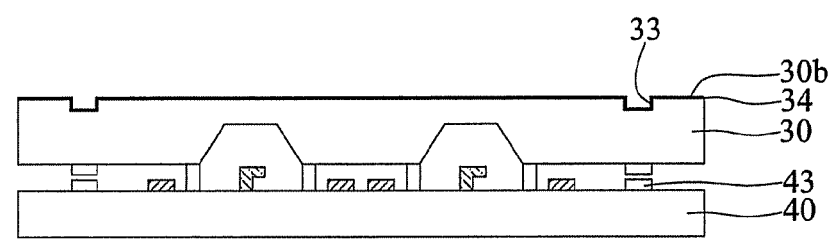

Referring to FIG. 3E, a double-sided aligner having an infrared light source is used for positioning and exposure so as to form a plurality of third alignment keys 33 corresponding to the second alignment keys 43, respectively. In particular, positioning and exposure processes are performed through the double-sided aligner and then a development process is performed by using a development device. Subsequently, an etching machine is used to form the third alignment keys 33, such as openings, on the second surface 30*b* of the plate 30. Thereafter, a metal layer 34 is formed on the second surface 30*b* of the plate 30 by sputtering or evaporation. The metal layer 34 can be made of sequentially deposited Al/Cu layers. It should be noted that, if the plate 30 is transparent, a single-sided aligner could be used instead.

Figure 3F:
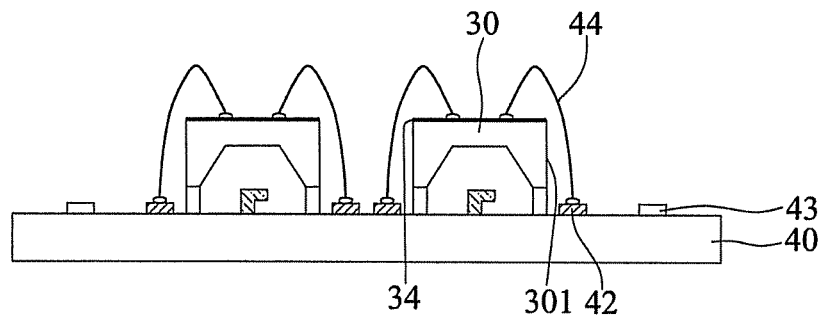

Referring to FIG. 3F, a cutting process is performed to the plate 30 so as to form openings 301 in the plate 30 for exposing the electrical contacts 42 and the second alignment keys 43. Then, the electrical contacts 42 and the metal layer 34 are connected through a plurality of bonding wires 44.

Figure 3G:
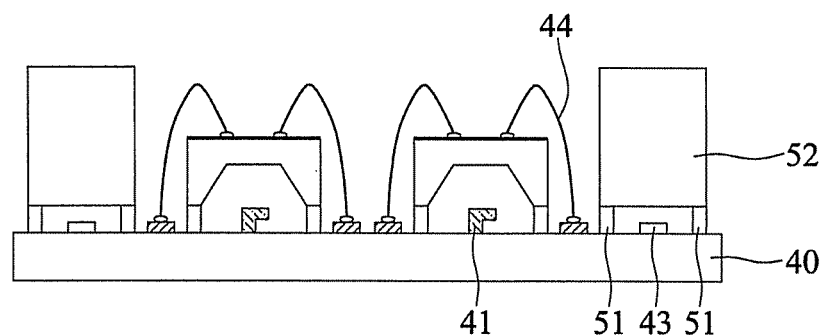
Figure 3G:
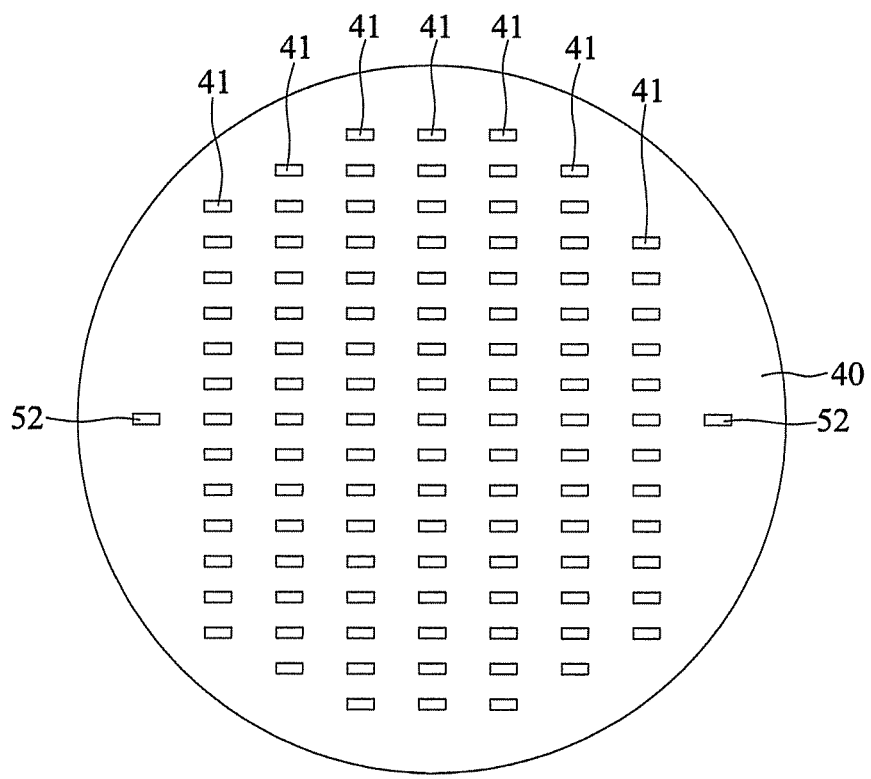

Referring to FIG. 3G, by using a die bonder, a plurality of block bodies 52 are disposed over the second alignment keys 43 through an adhesive 51 such that top surfaces of the block bodies 52 are higher than the bonding wires 44. The adhesive 51 can be made of glass frit, epoxy or dry film. The block bodies 52 can be made of a transparent material, such as glass or a silicon-containing material.

Referring to FIG. 3G', preferably, the number of the block bodies 52 is two. The two block bodies 52 are disposed at the periphery of the wafer 40 and opposite to each other. It should be noted that FIG. 3G' is provided only for the purpose of illustrating the positions of the block bodies 52 that correspond with the second alignment keys 43 and does not show all the components of FIG. 3G.

Figure 3H:
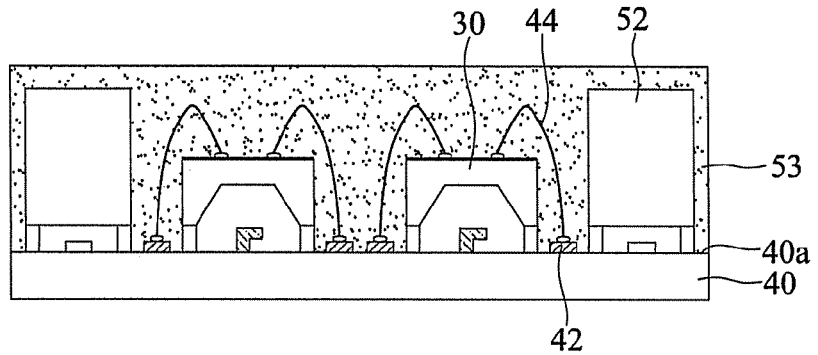

Referring to FIG. 3H, an encapsulant 53 is formed on the third surface 40*a* of the wafer 40 for encapsulating the plate 30, the electrical contacts 42, the block bodies 52 and the bonding wires 44.

Figure 3I:
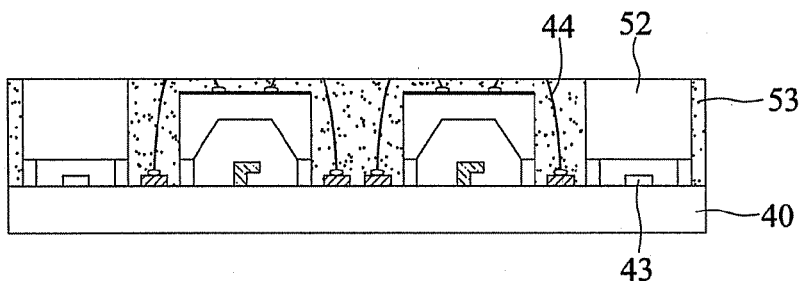

Referring to FIG. 3I, a grinding process is performed on a top surface of the encapsulant 53 to partially remove portions of the encapsulant 53, the bonding wires 44 and the block bodies 52, thereby exposing one end of each of the bonding wires 44 and the block bodies 52.

Figure 3J:
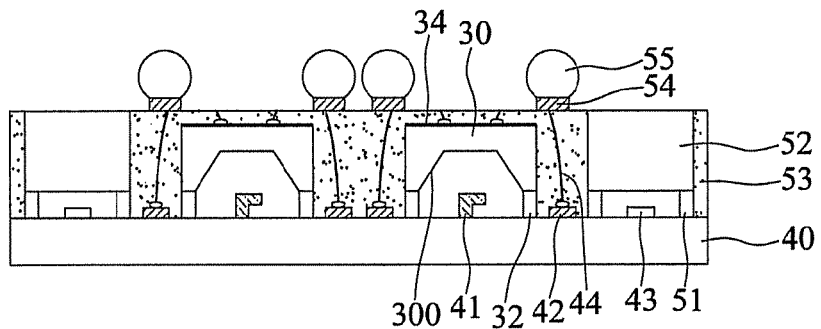
Figure 3J:
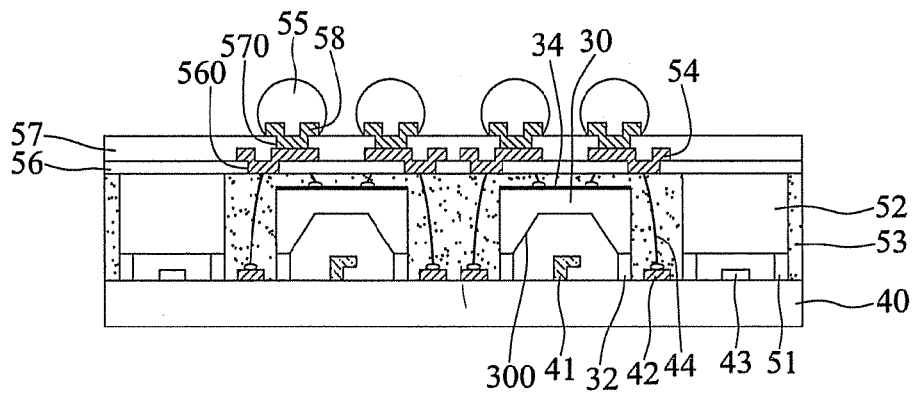

Referring to FIG. 3J, an aligner is used to align through the second alignment keys 43 so as to form a plurality of metal traces 54 on the encapsulant 53. The metal traces 54 are electrically connected to the electrical contacts 42 through the bonding wires 44. Further, a plurality of solder balls 55 are formed on the metal traces 54.

Alternatively, referring to FIG. 3J', a first insulating layer 56 is formed on the encapsulant 53 and has a plurality of openings 560 for exposing the ends of the bonding wires 44. A plurality of metal traces 54 are formed in the openings 560 of the first insulating layer 56 for electrically connecting with the bonding wires 44. Then, a second insulating layer 57 is formed on the first insulating layer 56 and the metal traces 54, wherein the second insulating layer 57 has a plurality of openings 570 for exposing portions of the metal traces 54. Further, an under bump metal layer 58 is formed in the openings 570 of the second insulating layer 57, and a plurality of solder balls 55 are formed on the under bump metal layer 58. That is, an RDL (Redistribution Line) process is performed to meet the fan out or fan in requirements of the conductive pads.

Figure 3K:
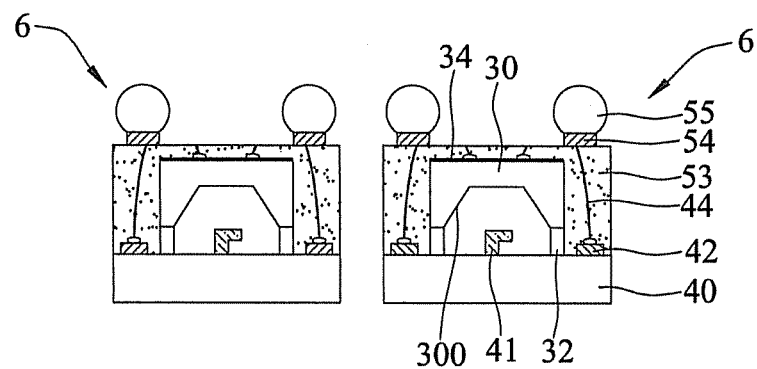

Referring to FIG. 3K, continued from FIG. 3J, a singulation process is performed to obtain a plurality of package structures 6 having MEMS elements.

Therefore, the present invention eliminates the need to form through holes in a silicon substrate as in the prior art so as to reduce equipment and fabrication costs. Further, since the plate only covers the MEMS elements and does not cover the bonding wires, and portions of the bonding wires are removed, the overall thickness and size of the package structure are reduced.

The above-described descriptions of the detailed embodiments are intended to illustrate the preferred implementation according to the present invention but are not intended to limit the scope of the present invention. Accordingly, many modifications and variations completed by those with ordinary skill in the art will fall within the scope of present invention as defined by the appended claims.

What is claimed is:

1. A fabrication method of a package structure having micro-electro-mechanical system (MEMS) elements, comprising the steps of:

preparing a plate having opposite first and second surfaces and preparing a wafer having opposite third and fourth surfaces, wherein the first surface of the plate has a plurality of first alignment keys, a plurality of recesses and a plurality seal rings disposed around peripheries of the recesses, and the third surface of the wafer has a plurality of MEMS elements, a plurality of electrical contacts and a plurality of second alignment keys;

bonding the plate and the wafer together by aligning the first alignment keys of the plate with the second alignment keys of the wafer and disposing the seal rings on the third surface of the wafer such that the MEMS elements of the wafer are disposed in the recesses and enclosed by the seal rings of the plate;

thinning the plate from the second surface thereof;

forming on the second surface of the plate a plurality of third alignment keys corresponding to the second alignment keys of the wafer, respectively;

forming a metal layer on the second surface of the plate;

cutting the plate to form therein a plurality of openings exposing the electrical contacts and the second alignment keys;

connecting the electrical contacts and the metal layer through a plurality of bonding wires;

disposing a plurality of block bodies over the second alignment keys through an adhesive such that top surfaces of the block bodies are higher than the bonding wires;

forming an encapsulant on the third surface of the wafer so as to encapsulate the plate, the electrical contacts, the block bodies and the bonding wires;

partially removing the encapsulant, the bonding wires and the block bodies from a top surface of the encapsulant so as to expose one end of each of the bonding wires and the block bodies; and aligning through the second alignment keys so as to form on the encapsulant a plurality of metal traces electrically connected to the electrical contacts through the bonding wires.

2. The method of claim 1, further comprising, before forming the metal traces, the step of forming a first insulating layer on the encapsulant, wherein the first insulating layer has a plurality of openings exposing the bonding wires so as for the metal traces to be formed in the openings of the first insulating layer and electrically connected with the bonding wires.

3. The method of claim 2, further comprising the step of forming a second insulating layer on the first insulating layer and the metal traces, wherein the second insulating layer has a plurality of openings exposing portions of the metal traces.

4. The method of claim 1, further comprising the step of forming a plurality of solder balls on the metal traces.

5. The method of claim 2, further comprising the step of forming a plurality of solder balls on the metal traces.

6. The method of claim 3, further comprising the step of forming a plurality of solder balls on the metal traces.

7. The method of claim 1, wherein the third alignment keys are openings.

8. The method of claim 1, wherein the number of the block bodies is two and the two block bodies are disposed at the periphery of the wafer and opposite to each other.

9. The method of claim 1, wherein the recesses are formed by DRIE, KOH or TMAH etching.

10. The method of claim 1, wherein the seal rings are made of glass frit, epoxy, dry film, Au, Cu, AuIn, solder, Ge, AlGe or SiGe.

11. The method of claim 1, wherein the metal layer is made of Al/Cu.

12. The method of claim 1, wherein the block bodies are made of glass or a silicon-containing material.

13. The method of claim 1, wherein the adhesive is made of glass frit, epoxy or dry film.

14. The method of claim 1, wherein the MEMS elements are gyroscopes, accelerometers or RF MEMS elements.

15. The method of claim 1, further comprising the step of performing a singulation process so as to obtain a plurality of package structures having MEMS elements.

16. The method of claim 1, wherein the fabrication of the third alignment keys comprises the steps of performing positioning and exposure processes through an aligner and then performing development and etching processes so as to form the third alignment keys.

* * * * *